Nov. 21, 1961 B. S. WILDI ET AL 3,009,981

PHOTOELECTRIC DEVICE

Filed June 1, 1959 2 Sheets-Sheet 1

*INVENTOR.*
ARNOLD S. EPSTEIN
BERNARD S. WILDI
*BY*
Lloyd B. Stevens, Jr.
ATTORNEY

*INVENTOR.*
ARNOLD S. EPSTEIN
BERNARD S. WILDI
*BY* Lloyd B. Stevens, Jr
ATTORNEY United States Patent Office 3,009,981
Patented Nov. 21, 1961

3,009,981
PHOTOELECTRIC DEVICE

Bernard S. Wildi and Arnold S. Epstein, Dayton, Ohio, assignors to Monsanto Chemical Company, St. Louis, Mo., a corporation of Delaware Filed June 1, 1959, Ser. No. 817,346
16 Claims. (Cl. 136—89)

The invention relates to photoelectric devices having an organic material forming an active element. More particularly the invention involves photosensitive polyphthalocyanine bodies and the use thereof in photoelectric, including solar devices. These bodies can suitably be in the form of discs, wafers, bars, rods, rectangular parallelepipeds, round, or most any geometric shape; however, thin discs, wafers or rectangular parallelepipeds are preferred.

It is well known in the art to employ inorganic materials as photosensitive components; however, no suitable organic material has previously been known. It has now been discovered that a certain type of organic material is useful for this purpose. These materials which are polyphthalocyanines are described in detail in copending application Serial No. 696,027, filed November 13, 1957.

It is an object of this invention to provide a new photoelectric device useful to operate or actuate almost any type of equipment to be controlled by light.

It is another object of this invention to provide a new solar cell for generating direct current power useful in charging storage batteries or for other direct current electrical power uses.

It is another object of this invention to provide a new photosensitive body which changes in resistivity upon exposure to light and so is useful in photoelectric devices operating upon this principle.

It is another object of this invention to provide a new photosensitive body especially useful in photoelectric and solar devices for generating direct current power.

These and other objects of the invention will become apparent as a detailed description of the invention proceeds.

In making the photosensitive bodies of the invention pyromellitonitrile, a new compound described in copending application Serial No. 696,026, filed November 13, 1957, now abandoned, is used. The tetrafunctional pyromellitonitrile provides the new class of polymeric material which can be illustrated by the structural formula

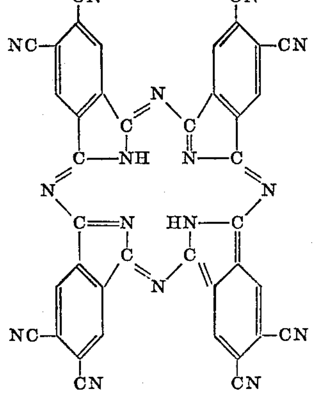

The pair of nitrile group on each of the four cyclic portions of the phthalocyanine structure are in turn joined with and form a part of similar phthalocyanine structures to provide a polyphthalocyanine. Whereas, the above structural formula is illustrative of the metal-free polyphthalocyanine, it will be readily understood that the metal polyphthalocyanines will have a similar structure. Illustrative of a monomeric metal phthalocyanine is copper phthalocyanine of the following structural formula

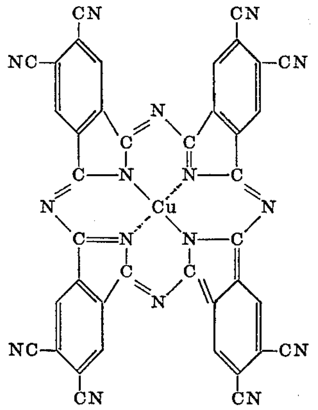

The preparation of the polyphthalocyanines and the metal polyphthalocyanines is described and illustrated in detail in copending application Serial No. 696,027, filed November 13, 1957. Thus, the polymeric materials useful in making the photosensitive bodies of this invention are, for example, polyphthalocyanine, zinc polyphthalocyanine, copper polyphthalocyanine, iron polyphthalocyanine, cobalt polyphthalocyanine, nickel polyphthalocyanine, palladium polyphthalocyanine, platinum polyphthalocyanine, lead polyphthalocyanine, magnesium polyphthalocyanine, and the like.

The following examples illustrate the preparation of copper polyphthalocyanine useful in making the photosensitive bodies of the invention.

*Example 1*

A mixture of 16 grams of pyromellitonitrile, 53 grams of cuprous chloride and 1 gram of urea was heated at 300° C. under 1000 p.s.i. of nitrogen pressure for 18 hours, and for 2 additional hours at 350° C. After the reaction vessel had cooled to room temperature the solid product was ground using a mortar and pestle. The ground material was triturated with ethanol, acetone, and ethyl acetyl acetate in the order given. No coloring of the solvents occurred, so it is assumed that there was no appreciable extraction from the powdered material. The material was next triturated with pyridine at room temperature and a considerable amount of green material was removed in the pyridine. The sample was then triturated with boiling pyridine until the triturates were colorless and the triturated material was dried at room temperature. Further processing of the dried material consisted of subjecting the material to vacuum sublimation at 350° C./0.5 mm. of Hg for 72 hours. Some white material sublimed out and was discarded. The residue from the sublimation operation was placed in a soxhlet apparatus and was extracted with pyridine for 48 hours. At the end of this 48 hour period the extracts from the residue were colorless. The residue was then filtered and washed with ethanol. Again the residue was subjected to sublimation procedure heating at 340° C./0.05 mm. of Hg for 6 hours. A small amount of white material sublimed out and was discarded. An elemental analysis of the residue product was as follows:

| Percent | Found | Calc'd for $C_{20}H_4N_8Cu$ |
|---|---|---|
| C | 52.8 | 57.2 |
| H | 1.3 | 0.96 |
| N | 26.6 | 26.7 |
| Cu | 15.9 | 15.1 |

*Example 2*

This example describes the heat treatment of a sample of the material of Example 1 to produce a material of different composition. A sample of 0.65 gram of a product of Example 1 was heated for 18 hours at 410° C./0.25 mm. of Hg. The sample lost 10.8% of its original weight. An elemental analysis of this heat treated sample was as follows:

| Percent: | Found |
|---|---|
| C | 52.7 |
| H | 1.3 |
| N | 24.2 |
| Cu | 16.6 |

It has been experimentally determined that when copper polyphthalocyanine is made as described hereinabove having an excess of copper over that stoichiometrically required that the material has P-type conductivity; however, when copper polyphthalocyanine is produced having less than the stoichiometric amount of copper, then the material has N-type conductivity. The degree of P-type or N-type conductivity will vary with the excess or deficiency of copper. The same situation prevails where other metals than copper are used. Also the doping techniques described hereinbelow regarding copper polyphthalocyanine are equally applicable to other polyphthalocyanines, especially other metal polyphthalocyanines.

*Example 3*

This example shows the testing of a sample in the shape of a rectangular parallelepiped of copper polyphthalocyanine for photosensitive properties. The samples were made by cold pressing at about 20,000 p.s.i. powdered material similar to that described as the product of Example 1. The sample copper polyphthalocyanine had a length of 2.3 cm., a width of 0.475 cm. and a thickness of 0.065 cm. The sample was supported within a closed container with a quartz window for the admission of light to the sample, and leads from the sample were extended outside the vessel. A constant current source was connected to the sample with the leads of the source being attached at the ends of the sample and the current flowing the length of the sample. Leads, 0.055 cm. apart, were attached along one side of the sample on a thin edge to measure the change in resistance of the sample upon exposure to light. A potentiometer was attached across the leads which were 0.055 cm. apart and the voltage drop across the potentiometer was balanced out to zero voltage prior to applying light to the sample.

The light source for illuminating the sample was an incandescent microscope illuminating light with a focusable condensing system and provision for filtering the light. The rated capacity of the light was 6.5 volts and 2.75 amperes or about 18 watts. A variable transformer was used to regulate the voltage applied to the light.

During the test the light was positioned about 1 foot from the sample, which had a 0.475 x 2.3 cm. side exposed to the light. Potentiometer measurements were made with the light off and at ⅓, ⅔ and full intensity of the light by adjustment of the variable transformer associated with the light. The data calculated from potentiometer readings are reported below as decreased resistance in the copper polyphthalocyanine sample between the potentiometer leads at the various light intensities, in one case using no filter on the light source and in another case using a blue filter. The leads including their point of attachment to the sample were shielded from the direct rays of the light source. The data are as follows:

| Light Intensity | Net Resistance Decrease $\Delta R$, Ohms | |
|---|---|---|
| | No Filter | Blue Filter |
| 0 | 0 | 0 |
| ⅓ | 2.73 | 2.43 |
| ⅔ | 800 | 275 |
| Full | 1,310 | 1,050 |

The light intensities were estimated from the variable transformer settings. The above data indicate that the sample of copper polyphthalocyanine showed appreciable photosensitive properties.

*Example 4*

This example describes additional photosensitive tests on samples of copper phthalocyanine. These samples which were in the form of rectangular parallelepipeds were cold pressed from powdered material similar to that described as the product of Example 1 at pressures of about 20,000 p.s.i. The sample dimensions in the first test 0.56 x 0.06 x 1.14 cm. Using silver paint a conducting strip was painted around the outside edges of a 0.56 x 1.14 cm. side and another conducting strip not connected to the outer strip was painted in the middle of the same side. Copper leads were soldered to each of these strips and the leads were attached to a microammeter. The opposite side of the sample than that to which the leads were attached was irradiated with an incandescent light source, and a current of 1 microampere was noted on the meter. Essentially this experiment is a qualitative experiment, but the potentialities of copper polyphthalocyanine for use in photoelectric or solar devices are clearly indicated.

Another experiment was conducted using a 0.56 x 0.043 x 1.14 cm. sample of copper polyphthalocyanine prepared by trimming down the sample of the experiment described in the immediately previous paragraph. In this case two F-shaped silver surfaces facing one another in an upsidedown fashion were applied to one of the large faces of the sample using silver paint. Copper leads were soldered to each of these surfaces, and the leads were attached to a microammeter. The opposite side of the sample than the leads were attached was irradiated with a stronger light source than in the previous experiment, and a current of 2.8 microamperes was measured with the meter. Again the experiment was essentially qualitative but the photovoltaic properties of the material are again clearly indicated and so the potential use of the material in photoelectric or solar devices.

*Example 5*

This example illustrates tests carried out to show the photovoltaic properties of copper polyphthalocyanine. A disc shaped sample about 1 mm. thick of copper polyphthalocyanine was used in the testing. This sample was sandwiched between brass plates, one of the brass plates having a hole in the center to permit light to reach the sample. In the sandwich one side of the sample was in direct contact with the brass plate not having a hole in it, and the other side of the copper polyphthalocyanine sample was pressed against the conducting surface of a glass plate, which insulated the sample from the brass plate with the hole in it. The conducting surface on the glass plate was transparent, e.g., being made of fused sodium chloride. The sandwich including the sample and glass plate was held together by bolts and nuts positioned near the four corners of the brass plates. These bolts and nuts fastening means by pressure exerted serve the further purpose of making ohmic contact between the conducting surface of the glass plate and the copper polyphthalocyanine wafer and between the unperforated brass plate and the wafer. Copper electrical leads are attached to the conducting surface of the glass plate and to the unperforated brass plate. This sandwich device is for convenience suspended with a metal container having a quartz window therein. The sandwich is turned so the brass plate with the opening is in front of the quartz window. The circuit was completed through a voltmeter and an ammeter to measure voltage and current developed.

The light source was a 115 volt-250 watt source positioned about 1 foot from the quartz window. The light source was turned on and off periodically and the voltage generated in the sample with time was recorded. It was noted that there was an immediate substantially instantaneous increase in voltage with time of the order of about 40–50 microvolts. Then there was a small additional increase in voltage with time, which is attributed to thermal effects. Clearly the instantaneously generated voltage is a photovoltaic voltage. Observed resistance of the disc was about 750 ohms.

The disc of copper polyphthalocyanine was then coated on the side to be exposed to light with a thin layer of 1,1,7,7-tetrakis(p-dimethylaminophenyl)trivinylcarbonium perchlorate deposited from a chloroform solution thereof. This coated disc was then exposed to light in the same manner as described in the paragraph immediately preceding. A photovoltaic voltage of 0.4 millivolt was generated and a current of $2\times10^{-10}$ amps. Resistance of the sample was 850 ohms.

In yet another experiment the 1,1,7,7-tetrakis(p-dimethylaminophenyl)trivinylcarbonium perchlorate coating was washed from the disc using boiling chloroform. The disc was then coated with octaphenylazaporphin on the side to be exposed to light. The light intensity in this experiment was varied and photovoltaic voltages of 0.2–0.8 millivolts were observed. Observed current was $8\times10^{-12}$ amps and the resistance was 56,000 ohms.

The invention will be more clearly understood from the following detailed description of specific embodiments thereof read in conjunction with the accompanying drawings wherein.

Figure 1:
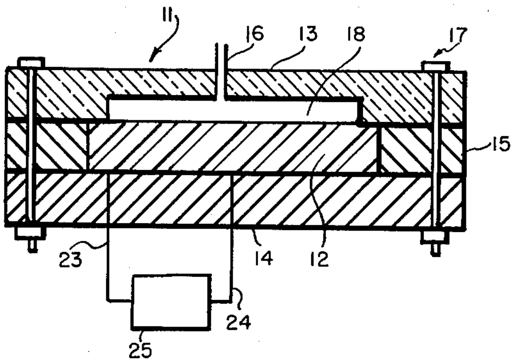
FIGURE 1 is an elevational view partially in section of one embodiment of the invention.

FIGURE 1 shows a photoelectric device or element or cell 11. The active material in this device is photosensitive body 12 which is in the form of a disc or wafer of copper polyphthalocyanine. Frame 13 made of glass, quartz, mica or other suitable light transparent substance having electrical insulating properties forms the upper portion of device 11. Frame 13 is in the form of a disc with an aperture 18 on the bottom side thereof. Communicating with aperture 18 is passage 16. Frame 14 suitably in the form of a disc or circular plate forms the bottom portion of device 11 and frame 14 is suitably made of most any type of organic or inorganic electrical insulating material, e.g., glass, quartz, mica, polystyrene, Bakelite, etc. The sides of device 11 are formed by gasket 15 suitably made of rubber or other electrical insulating material. Nuts and bolts 17 regularly spaced near the outer edge of the device serve to hold the parts of the cell together. Electrical leads 23 and 24 connect to conducting surfaces on disc 12 as will be described in more detail hereinbelow. Leads 23 and 24 are connected to load 25 which is an electrical load such as a storage battery to be charged, a transistor receiver, a microswitch, etc.

The passage 16 is useful if desired to maintain photosensitive body 12 under high vacuum or any desired atmosphere. After the desired conditions are provided for in aperture 18, passage 16 is sealed off. If desired, body 12 can be subjected to a conventional out-gassing technique consisting of heating body 12 under a high vacuum of about $10^{-2}$ to $10^{-5}$ mm. of Hg through several cycles of heating to about 250° C. and allowing to cool to room temperature. By this technique, copper polyphthalocyanine in its undoped state having N-type conductivity is transformed to P-type conductivity. After this outgassing technique, passage 16 is sealed off leaving disc 12 encapsulated under high vacuum. When using a doped copper polyphthalocyanine or if N-type conductivity is desired, passage 16 can be eliminated and no precautions taken in assembling the device to produce the P-type conductivity disc.

Figure 2:
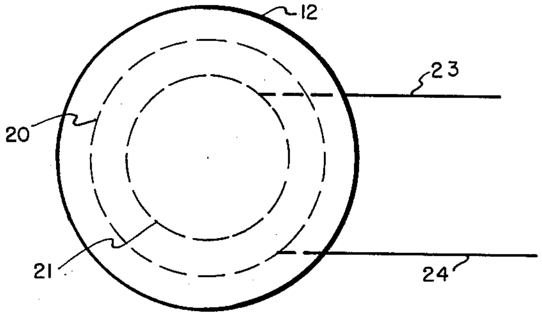
FIGURE 2 is a top view of a photosensitive body of the invention usable in the element or cell or device of FIGURE 1.

In FIGURE 2 is shown disc 12 with details as to the arrangement of conducting surfaces thereon. FIGURE 2 is a top view of wafer or disc 12. The inner boundary of the outer conducting surface on the bottom of disc 12 is designated as numeral 20 and this conducting surface consists of an annular strip extending from inner edge 20 out to the outer edge of disc 12. The inner conducting surface on disc 12 is circular and the outer boundary thereof is indicated by numeral 21. These conducting surfaces on the bottom portion of disc 12 can be applied to form ohmic contact with the copper polyphthalocyanine disc by evaporating on silver to the disc which has previously been masked to protect area which is not desired to be coated. Another noble metal conducting surface can be applied in like manner. An alternative way to apply the conducting surface is for example, with silver paint which is commercially available, or with paint made from other noble metals. Leads 23 and 24 can be electrically connected to conducting surfaces 20 and 21, respectively, by, for example, soldering the leads, which can conveniently be of copper or aluminum, to the conducting surface using for example, a lead-tin utectic alloy having some cadmium therein.

Figure 3:
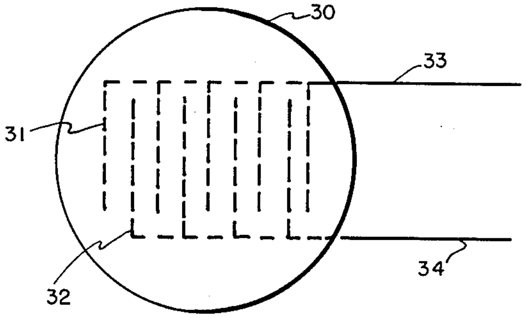
FIGURE 3 is another embodiment of a photosensitive body usable in the device of FIGURE 1.

An alternative arrangement of conducting surfaces is shown on photoconductive body or disc 30 of FIGURE 3. Again the conducting surfaces 31 and 32 are applied to the bottom surface of disc 30, i.e., the surface of the disc not to be exposed to light. Conducting surfaces 31 and 32 consist of a number of multi-branched leads which can be applied to disc 30 in a manner similar to that described for the application of surfaces 20 and 21. Leads 33 and 34 for external connection from disc 30 are conveniently attached to conducting surfaces 31 and 32, respectively, in a similar manner to that described for the attachment of the leads of disc 12.

Figure 4:
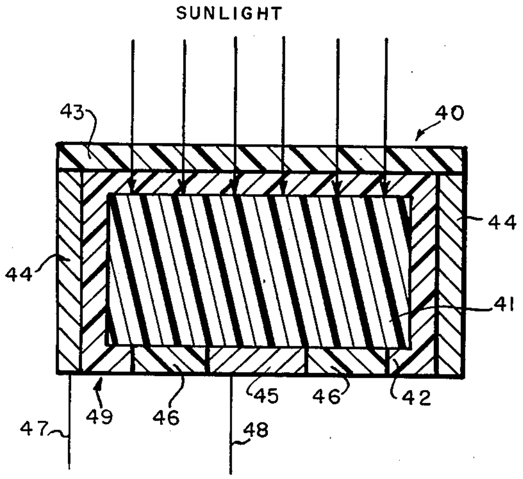
FIGURE 4 is another embodiment of a device of the invention.

FIGURE 4 describes a different device or element or cell 40 of the invention wherein copper polyphthalocyanine having a P-N junction therein is used. The photosensitive body in device 40 is disc 49 which is composed of, for example, an N-type portion 41 of copper polyphthalocyanine and a thin P-type portion 42. This cell 49 can conveniently be made by taking a disc of copper polyphthalocyanine and subjecting the outer surface thereof to bromine vapors. The bromine vapors penetrate to a limited degree into the surface of the disc forming a P-N-junction area just a short distance below the surface of the disc. Surface 44 in the form of a hollow cylindrical surface can conveniently be bonded ohmically to the P-type edge of disc 49 in a similar manner to that described in the discussion of FIGURE 2, i.e., 44 can conveniently be a silver coating. The second conducting surface 45 can be applied in a similar manner to N-type conducting portion 41. It will be necessary to abrade off the P-type layer 44 in the area where it is desired to attach conducting surface 45. Also conducting surface 45 should be electrically insulated from the P-type portion by the interposition, e.g., of electrical insulating surface 46 suitably wax or most any other type of electrical insulating coating which is applied completely isolating surface 45 from P-type portion 49. Before surface 46 is applied it will be necessary to scrape or abrade off the P-type layer in the area of application. Alternatively, during bromine treatment the area to be covered by surface or coating 46 and conducting surface 45 can conveniently be masked to prevent bromine from penetrating the surface of the copper polyphthalocyanine in these areas. It is preferred to have a protective coating or surface such as 43, conveniently polystyrene for protecting the upper P-type surface of body 49 from corrosion or weathering. Protective coating 43 must necessarily not substantially restrict the penetration of light or sunlight to the upper surface of disc or body 49, i.e., it must be transparent. It might also be preferred to coat the balance of the entire uncovered outer surface of P-type layer with wax or a protective plastic of some kind. Leads 47 and 48 are conveniently attached to conductive surfaces 44 and 45, respectively, in a manner similar to that described in the discussion of FIGURE 2. It should be realized that although FIGURE 4 shows a complete device, this same device could, if desired, be incorporated in the device of FIGURE 1 in a similar manner as are bodies 12 and 30. Protective surfaces 43 and 46 would not then be desirable and cell 40 would in essence become photosensitive body 40.

Figure 5:
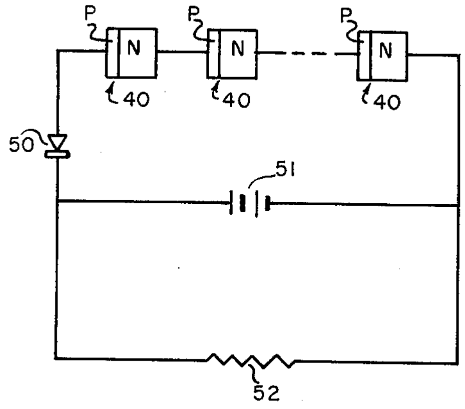
FIGURE 5 is a schematic drawing showing a number of devices described in FIGURE 4 connected in a series circuit for charging a storage battery.

In FIGURE 5 a number of the devices 40 of FIGURE 4 are connected in series in a circuit designed to charge a storage battery. In each of the devices 40 in FIGURE 5 the P-type and N-type zones are labeled P and N and the P-N junction indicated. Element 50 is a unilaterally conducting element, for example, a crystal diode, polled to provide a low resistance to charging currents developed by the devices but high resistance to any discharging currents from the battery to the devices. Resistance 52 represents a load to which storage battery 51 is supplying electricity. A suitable number of devices 40 would be used to adequately charge storage battery 51. A number of devices 11 embodying photosensitive body 40 as described in the previous paragraph could be used in place of the embodiment of FIGURE 4 in the circuit of FIGURE 5 if desired.

For optimum efficiency in a photo-cell and particularly in a solar cell for transforming sunlight into electrical energy, photosensitive bodies 12, 30 and 49 should have a total thickness of not more than about 40 mils. In the case of FIGURE 4 for optimum efficiency, the P-type layer should be no thicker than about 0.1 mil or no thicker than the diffusion length of electrons in the material. In essence structurally as thin a photosensitive disc as can be made and satisfactorily used in the device should be used. If the photoconductive body were appreciably thicker than 40 mils, e.g., greater than about 100 mils, the efficiency of the device would be substantially reduced, since the electricity generated in the device by the light or sunlight would be at least partially dissipated before reaching the conducting surfaces on the photosensitive body.

The bromine treatment of photosensitive body 49 described in FIGURE 4 is conveniently carried out at atmospheric pressure and room temperature (about 23° C.). By treating or doping copper polyphthalocyanine powder with bromine and hot-pressing the treated material a disc of permanent P-type material is formed which does not change to N-type material upon exposure to the atmosphere or water vapor. The bromine-treated copper polyphthalocyanine of course needs no encapsulation under high vacuum for it to maintain its P-type conductivity and such a P-type material could be used to make photosensitive bodies 12 or 30.

Doping is known in the art as adding small amounts of foreign materials to change the degree of conductivity and/or type of conductivity of a semiconductive material. Generally when treating copper polyphthalocyanine with a gaseous doping agent, such as bromine, hydrogen sulfide, oxygen or water vapor the copper polyphthalocyanine will be saturated with these doping agents at the particular temperature and pressure of treatment, and actual treatments were carried out at room temperatures and atmospheric pressure using these doping agents. Rather than treating the powder material the bodies, e.g., discs of copper polyphthalocyanine can be treated; however, this type of treatment will probably result in inhomogeneously treated material, which can be desirable in some instances as when P-N type junction material is desired. The other halogens as well as the bromine used to treat copper polyphthalocyanine also produce P-type conductivity material. Other materials to treat copper polyphthalocyanine to produce P-type material are oxygen, ozone, sulfur, selenium and tellurium. As has been pointed out hereinabove copper polyphthalocyanine produced having an excess of copper therein will also be P-type conducting. In the case of oxygen treatment, it is desirable to encapsulate the disc in oxygen atmosphere. The bromine treated or other doped P-type copper polyphthalocyanine discs can be used in the photosensitive body of FIGURES 2 and 3.

In copending applications Serial Nos. 817,058 and 817,059 filed of even date are described various methods or techniques for preparing and/or treating polyphthalocyanines to change the conductivity thereof. These polyphthalocyanines are also useful for polyphthalocyanine bodies for the photoelectric devices of this invention, and the metal polyphthalocyanines are especially useful. Some of these methods are discussed herein, but they are meant to be illustrative of the methods and suitable polyphthalocyanine bodies produced therefrom.

A disc of copper polyphthalocyanine exposed to the atmosphere, i.e., to water vapor will be N-type conductive unless the effect of the water vapor is overcome by doping with materials to produce P-type conductivity. Also copper polyphthalocyanine produced having a stiochiometric deficiency of copper has N-type conductivity. A method of making a stable N-type copper polyphthalocyanine disc using water vapor is to saturate copper polyphthalocyanine powder with water vapor and hot press this powder to produce a disc or other body with care being taken to prevent the escape of water during hot pressing. Suitably this hot pressing is carried out at about 220° C. and 20,000 p.s.i. Another type of treatment to produce N-type conductivity in copper polyphthalocyanine is hydrogen sulfide treatment.

The treating or doping used on copper polyphthalocyanine is a method of controlling the degree of electronic (or positive hole) mobility in copper polyphthalocyanine. The degree of mobility varies with the amount and type of doping agent used. In the case of water vapor and oxygen mobility changes of the order of 10:1 have been produced at room temperature (23° C.).

From what has been said hereinabove regarding doping, it is clear that, for example, that the portion 41 in FIGURE 4 could be either N-type or P-type conductivity with portion 42 being the opposite type. In making the particular photosensitive body or disc 49 of FIGURE 4, it is preferred to treat powdered copper polyphthalocyanine with water vapor to saturate it then hot press the treated material as described hereinabove to produce a photosensitive body having N-type conductivity. The surface area of this body is then treated with bromine vapor under pressure and at elevated temperatures, if necessary, to overcome this N-type conductivity forming P-type conductivity in a small outer layer of the body providing for the P-N type junction. Other discs having other arrangements and degrees of conductivity could obviously be made in like fashion.

In testing the photosensitive property of N-type and P-type copper polyphthalocyanine it has been noted that the N-type responds more to the shorter infrared wave lengths, whereas, the P-type responds to the longer infrared wave lengths. It is indicated that in general whether the copper polyphthalocyanine be N-type or P-type the material tends to be selective within the infrared range. It does respond to other light than infrared light but to a greater degree to infrared. It is indicated therefore that N-type or P-type copper polyphthalocyanine can be used as the detecting element in an infrared detector. Also mixtures of N-type and P-type material pressed into bodies or wafers or having N-P type junctions can be very useful for such a purpose. Other polyphthalocyanines, especially metal polyphthalocyanines show similar activity.

Due to their semiconductive properties polyphthalocyanines, especially the metal polyphthalocyanines are useful in making resistors. For example, copper polyphthalocyanines have been made having resistivities of as low as 100 ohm-cm. The resistance of the resistor can be fixed by the geometry of the resistor and/or by varying the molecular weight of the polyphthalocyanine polymer since resistivity decreases with increasing molecular weight.

Although the invention has been described in terms of specified apparatus which is set forth in considerable detail, it should be understood that this is by way of illustration only and that the invention is not necessarily limited thereto, since alternative embodiments and operating techniques will become apparent to those skilled in the art in view of the disclosure. Accordingly, modifications are contemplated which can be made without departing from the spirit of the described invention.

What is claimed is:

1. A photoelectric device comprising a photosensitive body of a polyphthalocyanine having separated electrically conducting surfaces making ohmic contact with said body, a transparent frame for enclosing and covering a portion not having conducting surfaces thereon of said photosensitive body, another frame for enclosing said photosensitive body, and means for joining said frames to enclose said photosensitive body.

2. A photoelectric device comprising a photosensitive body of a polyphthalocyanine and separated electrical conductors making ohmic contact with said body.

3. The device of claim 2, wherein said body is a disc having a thickness of not more than about 40 mils, and said conducting surfaces are on the same side of said body.

4. The device of claim 3, wherein there are two conducting surfaces one in the form of a centrally located area bounded by a circle and the other an annular surface concentric with and surrounding said circular surface.

5. The device of claim 3, wherein there are two conducting surfaces consisting of parallel thin strips for the attachment of electrical leads with thin perpendicular strips extending from each of said parallel strips toward the opposite parallel strip.

6. The device of claim 2, wherein said polyphthalocyanine is a metal polyphthalocyanine.

7. The device of claim 2, wherein said polyphthalocyanine is a copper polyphthalocyanine.

8. The device of claim 7, wherein said polyphthalocyanine is a bromine-treated copper polyphthalocyanine.

9. The device of claim 7, wherein said polyphthalocyanine is hydrogen sulfide-treated copper polyphthalocyanine.

10. The device of claim 7, wherein said polyphthalocyanine is oxygen-treated copper polyphthalocyanine.

11. The device of claim 7, wherein said polyphthalocyanine is a water vapor-treated copper polyphthalocyanine.

12. The device of claim 7, wherein a portion of said polyphthalocyanine body is coated with octaphenylazaporphin.

13. A photoelectric device for converting light into electrical energy comprising a photosensitive polyphthalocyanine body having an N-type zone and a P-type zone contiguous therewith forming a P-N junction, the thinner of the two zones having a thickness of not more than about the diffusion length of electrons therein, and conducting surfaces making ohmic contact with the N-type and P-type zones to facilitate the attachment of electrical connections.

14. The device of claim 13, wherein a transparent coating covers a portion of the area of said thin zone.

15. A photoelectric device for converting light into electrical energy comprising a photosensitive polyphthalocyanine body having an N-type zone and a P-type zone contiguous therewith forming a P-N junction, the thinner of the two zones having a thickness of not more than about 0.1 mil and the thickness of the thicker zone being not more than about 40 mils, conducting surfaces making ohmic contact with the N-type and the P-type zones to facilitate the attachment of electrical connections.

16. The device of claim 15, wherein a transparent coating covers a portion of the area of said thin zone.

References Cited in the file of this patent

UNITED STATES PATENTS

| | | |
|---|---|---|
| 2,349,754 | Porter | May 23, 1944 |
| 2,732,469 | Palmer | Jan. 24, 1956 |

FOREIGN PATENTS

| | | |
|---|---|---|
| 348,109 | Great Britain | May 4, 1931 |
| 360,391 | Great Britain | Apr. 29, 1930 |

OTHER REFERENCES

Coblenz: Electronics, November 1, 1957, pages 144–149.